United States Patent
Chen

(10) Patent No.: US 9,589,883 B2
(45) Date of Patent: Mar. 7, 2017

(54) DOUBLE-SIDED CHIP ON FILM PACKAGING STRUCTURE AND MANUFACTURING METHOD THEREOF

(71) Applicant: Raydium Semiconductor Corporation, Hsinchu (TW)

(72) Inventor: Ching-Yung Chen, Taoyuan (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 14/932,238

(22) Filed: Nov. 4, 2015

(65) Prior Publication Data
US 2016/0133550 A1 May 12, 2016

(30) Foreign Application Priority Data
Nov. 7, 2014 (TW) .............................. 103138810 A

(51) Int. Cl.
| | |
|---|---|
| H01L 23/48 | (2006.01) |
| H05K 1/00 | (2006.01) |
| H01L 21/00 | (2006.01) |
| H01L 23/498 | (2006.01) |
| H01L 23/538 | (2006.01) |
| H01L 23/00 | (2006.01) |
| H01L 21/56 | (2006.01) |

(52) U.S. Cl.
CPC .... *H01L 23/4985* (2013.01); *H01L 23/49838* (2013.01); *H01L 23/5387* (2013.01); *H01L 24/83* (2013.01); *H01L 21/563* (2013.01); *H01L 24/86* (2013.01); *H01L 2224/16225* (2013.01); *H01L 2224/73204* (2013.01); *H01L 2924/0002* (2013.01)

(58) Field of Classification Search
CPC ... H01L 24/83; H01L 23/49838; H01L 24/16; H01L 23/4985; H01L 24/86; H01L 24/10; H01L 23/5387
See application file for complete search history.

(56) References Cited

U.S. PATENT DOCUMENTS

| | | | | |
|---|---|---|---|---|
| 8,222,089 B2 * | 7/2012 | Choi | ................. | H01L 23/49838 257/E23.005 |
| 2006/0157827 A1 * | 7/2006 | Tanaka | ................ | H01L 23/4985 257/642 |
| 2008/0258290 A1 * | 10/2008 | Nakajima | ............... | H01L 24/27 257/690 |

(Continued)

*Primary Examiner* — Alonzo Chambliss

(57) ABSTRACT

A double-sided chip on film (COF) packaging structure and a manufacturing method thereof are disclosed. The double-sided COF structure includes a metal layer, a first insulating layer, a second insulating layer, a chip, and an encapsulant. The first insulating layer and second insulating layer are disposed on a first surface and a second surface of metal layer respectively. The first surface and second surface are opposite. The first insulating layer includes a first part and a second part separated from each other. An accommodating space is existed between the first part and the second part and a part of the first surface is exposed. The chip is accommodated in the accommodating space and disposed on the exposed part of the first surface. The encapsulant fills the spaces between the chip and the first part and between the chip and the second part to form the double-sided COF packaging structure.

8 Claims, 4 Drawing Sheets

(56) References Cited

U.S. PATENT DOCUMENTS

| | | | |
|---|---|---|---|
| 2009/0273076 A1* | 11/2009 | Choi | H01L 23/49838 257/702 |
| 2009/0321918 A1* | 12/2009 | Lin | H01L 21/563 257/690 |
| 2011/0304991 A1* | 12/2011 | Huang | B82Y 10/00 361/719 |
| 2014/0264803 A1* | 9/2014 | Lin | H01L 23/13 257/676 |

* cited by examiner

DOUBLE-SIDED CHIP ON FILM PACKAGING STRUCTURE AND MANUFACTURING METHOD THEREOF

BACKGROUND OF THE INVENTION

Field of the Invention

This invention relates to chip on film (COF), especially to a double-sided COF packaging structure and a manufacturing method thereof.

Description of the Related Art

Please refer to FIG. 1. FIG. 1 illustrates a schematic diagram of a conventional double-sided COF packaging structure. As shown in FIG. 1, the conventional double-sided COF packaging structure 1 at least includes a polyimide (PI) insulating layer 10, a first copper foil 12, a second copper foil 14, a chip 16, a protection layer 17, and an underfill 18. The first copper foil 12 and the second copper foil 14 are disposed on a first surface 10A and a second surface 10B of the PI insulating layer 10 respectively, and the first surface 10A and the second surface 10B of the PI insulating layer 10 are opposite.

Because the first copper foil 12 and the second copper foil 14 disposed on the opposite sides of the PI insulating layer 10 should be electrically connected, the PI insulating layer 10 is penetrated through to form a via 19 and a via plating process is used to electrically connecting the first copper foil 12 and the second copper foil 14 through the via 19 in the conventional method of manufacturing the double-sided COF packaging structure 1. However, the above-mentioned via manufacturing process and via plating process may cause the entire manufacturing process become more complicated and the production yield will also become poor; therefore, the cost of manufacturing the conventional double-sided COF packaging structure will be largely increased and its competitiveness will be also damaged.

SUMMARY OF THE INVENTION

Therefore, the invention provides a double-sided COF packaging structure and a manufacturing method thereof to solve the above-mentioned problems.

An embodiment of the invention is a double-sided COF packaging structure. In this embodiment, the double-sided COF structure includes a metal layer, a first insulating layer, a second insulating layer, a chip, and an encapsulant. The first insulating layer and second insulating layer are disposed on a first surface and a second surface of metal layer respectively. The first surface and second surface are opposite. The first insulating layer includes a first part and a second part separated from each other. An accommodating space is existed between the first part and the second part and a part of the first surface is exposed. The chip is accommodated in the accommodating space and disposed on the exposed part of the first surface. The encapsulant fills the spaces between the chip and the first part and between the chip and the second part to form the double-sided COF packaging structure.

In an embodiment, the metal layer is a copper foil.

In an embodiment, the first insulating layer and the second insulating layer are Polyimide (PI) or solder resist (SR).

In an embodiment, the encapsulant is an underfill.

In an embodiment, the first insulating layer further comprises a third part separated from the second part, another accommodating space is existed between the second part and the third part and another exposed part of the first surface is exposed, a passive component is accommodated in the another accommodating space and disposed on the another exposed part of the first surface.

Another embodiment of the invention is a double-sided COF packaging structure manufacturing method. In this embodiment, the double-sided COF packaging structure manufacturing method includes steps of: providing a metal layer having a first surface and a second surface, wherein the first surface and the second surface of the metal layer are opposite; disposing a first insulating layer and a second insulating layer on the first surface and the second surface of the metal layer respectively; forming an accommodating space on the first insulating layer to expose an exposed part of the first surface, wherein the first insulating layer comprises a first part and a second part separated from each other; accommodating the chip in the accommodating space and disposing the chip on the exposed part of the first surface; and filling an encapsulant into spaces between the chip and the first part and between the chip and the second part to form the double-sided COF packaging structure.

Compared to the prior art, since two insulating layers of the invention are disposed at two opposite sides of the metal layer respectively to avoid the via manufacturing process and via plating process used to manufacture the double-sided COF packaging structure 1 of FIG. 1, the complication of the entire manufacturing process can be largely reduced to effectively enhance the production yield. Therefore, the cost of manufacturing the double-sided COF packaging structure of the invention can be largely decreased and its competitiveness will be also enhanced.

In addition, since the traces in the entire double-sided COF packaging structure are all disposed in the same metal layer, the reliability of the double-sided COF packaging structure can be as good as the single-sided COF packaging structure, and a semi-additive process (SAP) or etching process can be also used to achieve the fine pitch effect, and the smallest pitch of 15 um can be even reached to decrease the volume of the entire double-sided COF packaging structure.

The advantage and spirit of the invention may be understood by the following detailed descriptions together with the appended drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

A preferred embodiment of the invention is a double-sided COF packaging structure. In this embodiment, the double-sided COF packaging structure is used to package a chip, and the chip can be a driving chip applied to a display apparatus, but not limited to this.

Figure 2:
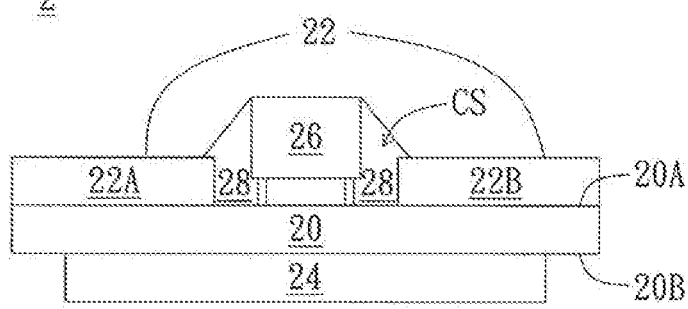
FIG. 2 illustrates a schematic diagram of a double-sided COF packaging structure in a preferred embodiment of the invention.

Please refer to FIG. 2. FIG. 2 illustrates a schematic diagram of the double-sided COF packaging structure in this embodiment. As shown in FIG. 2, the double-sided COF structure 2 at least includes a metal layer 20, a first insulating layer 22, a second insulating layer 24, a chip 26, and an encapsulant 28.

In this embodiment, the first insulating layer 22 and the second insulating layer 24 are disposed on a first surface 20A and a second surface 20B of the metal layer 20 respectively. The first surface 20A and the second surface 20B of the metal layer 20 are opposite; for example, the first surface 20A and the second surface 20B can be the upper surface and the lower surface of the metal layer 20 shown in FIG. 2, but not limited to this.

In order to couple the chip 26 with the metal layer 20, the first insulating layer 22 includes a first part 22A and a second part 22B separated from each other. An accommodating space CS is existed between the first part 22A and the second part 22B and an exposed part of the first surface 20A of the metal layer 20 is exposed. Therefore, the chip 26 can be accommodated in the accommodating space CS between the first part 22A and the second part 22B and the chip 26 can be disposed on the exposed part of the first surface 20A of the metal layer 20 to couple with the metal layer 20.

In addition, in order to properly package the chip 26 to protect the operation of the chip 26 from being affected by outside, the encapsulant 28 is used to fill the spaces between the chip 26 and the first part 22A of the first insulating layer 22 and between the chip 26 and the second part 22B of the first insulating layer 22 to form the double-sided COF packaging structure 2.

In practical applications, the metal layer 20 can be a copper foil or any other conductive metal materials; the first insulating layer 22 and the second insulating layer 24 can be Polyimide (PI), solder resist (SR), or any other insulating materials; the encapsulant 28 can be an underfill or any other filling materials capable of effectively filling the spaces between the chip 26 and the first part 22A of the first insulating layer 22 and between the chip 26 and the second part 22B of the first insulating layer 22, but not limited to this.

It should be noticed that the double-sided COF packaging structure 2 of FIG. 2 can be also upside down to become an another embodiment of disposing the chip 26 under the metal layer 20, and the another embodiment is also in the scope of the invention.

Figure 3:
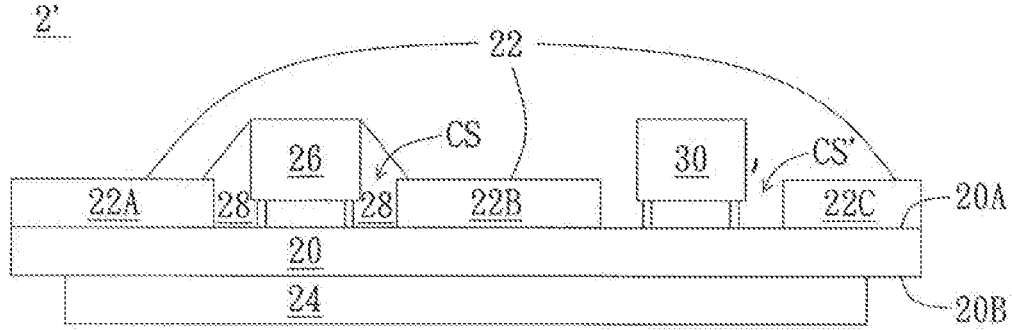
FIG. 3 illustrates a schematic diagram of a double-sided COF packaging structure in another preferred embodiment of the invention.

Then, please refer to FIG. 3. In the double-sided COF packaging structure 2', the first insulating layer 22 includes not only the first part 22A and the second part 22B, but also a third part 22C separated from the second part 22B. Another accommodating space CS' is existed between the second part 22B and the third part 22C and another exposed part of the first surface 20A of the metal layer 20 is exposed. At this time, a passive component 30 can be accommodated in the another accommodating space CS' between the second part 22B and the third part 22C and the passive component 30 can be disposed on the another exposed part of the first surface 20A of the metal layer 20 to couple with the metal layer 20.

Another embodiment of the invention is a double-sided COF packaging structure manufacturing method. In this embodiment, the double-sided COF packaging structure manufacturing method is used to manufacture a double-sided COF packaging structure, but not limited to this.

Figure 4:
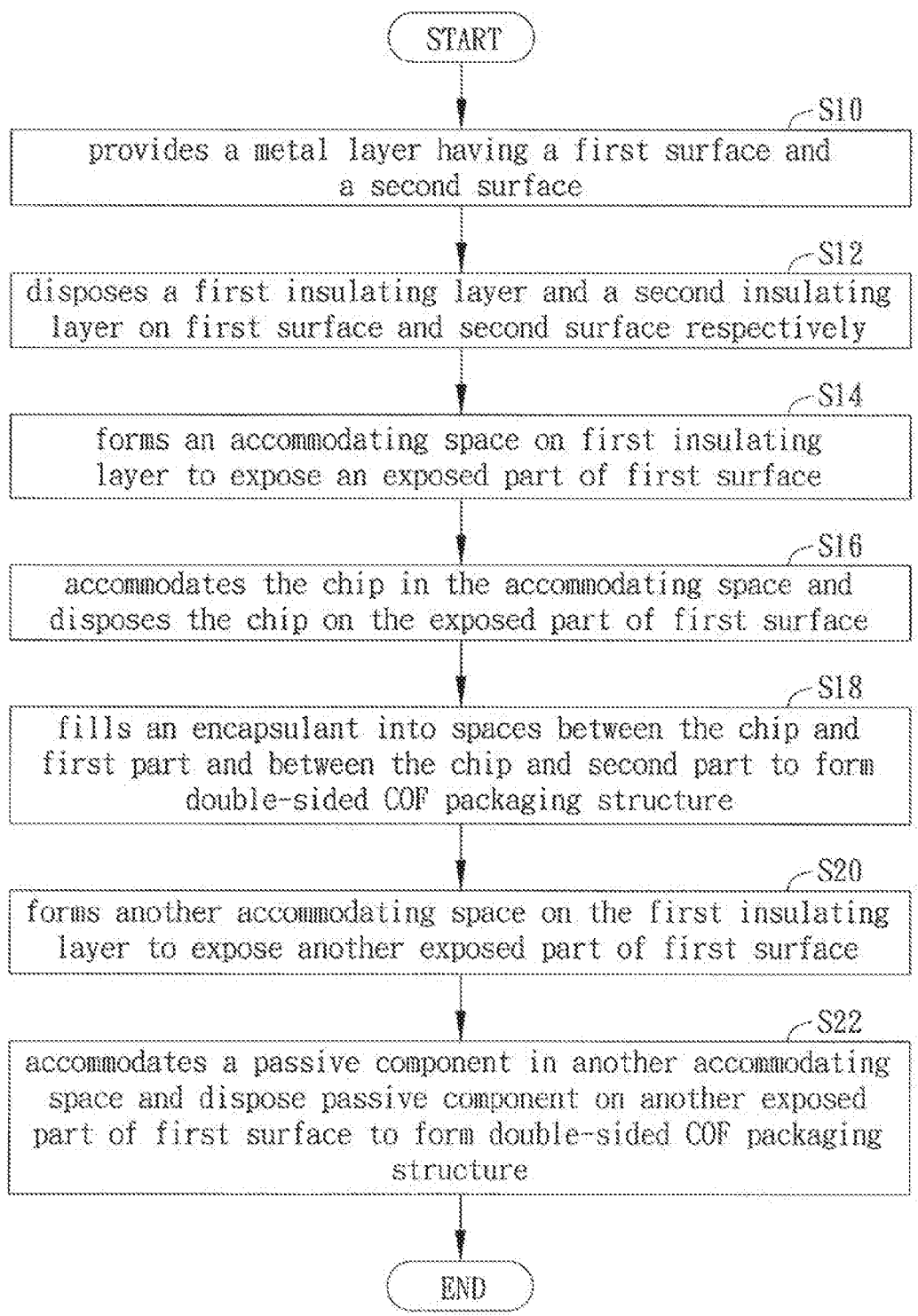
FIG. 4 illustrates a flow chart of a double-sided COF packaging structure manufacturing method in another preferred embodiment of the invention.

Please refer to FIG. 4 and FIG. 5A~FIG. 5G. FIG. 4 illustrates a flow chart of a double-sided COF packaging structure manufacturing method in this embodiment. FIG. 5A~FIG. 5G illustrate the steps in FIG. 4 respectively.

Figure 5A:
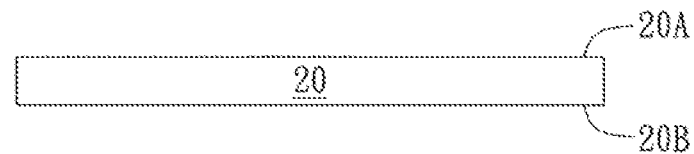
FIG. 5A, FIG. 5B, FIG. 5C, FIG. 5D, FIG. 5E, FIG. 5F, and FIG. 5G illustrate the steps in FIG. 4 respectively.

As shown in FIG. 4 and FIG. 5A, in the step S10, the method provides a metal layer 20 having a first surface 20A and a second surface 20B, wherein the first surface 20A and the second surface 20B of the metal layer 20 are opposite. In practical applications, the metal layer 20 can be a copper foil or any other conductive metal materials, but not limited to this.

Figure 5B:
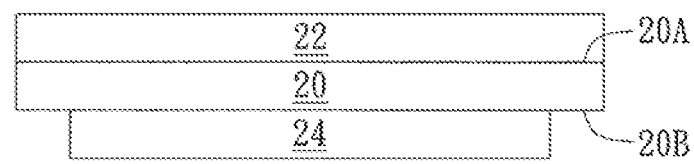

As shown in FIG. 4 and FIG. 5B, in the step S12, the method disposes a first insulating layer 22 and a second insulating layer 24 on the first surface 20A and the second surface 20B of the metal layer 20 respectively. In practical applications, the first insulating layer 22 and the second insulating layer 24 can be Polyimide (PI), solder resist (SR), or any other insulating materials, but not limited to this.

Figure 5C:
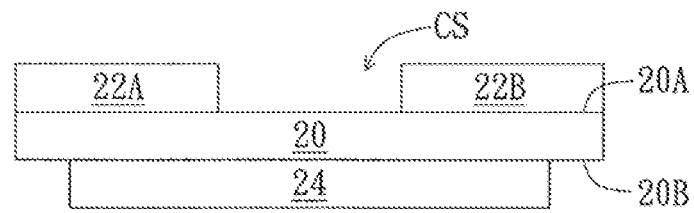

As shown in FIG. 4 and FIG. 5C, in the step S14, the method forms an accommodating space CS on the first insulating layer 22 to expose an exposed part of the first surface 20A of the metal layer 20, wherein the first insulating layer 22 includes a first part 22A and a second part 22B separated from each other. In practical applications, the method can perform the step S14 to use a common-used etching method to etch the first insulating layer 22 until the metal layer 20 is exposed.

Figure 5D:
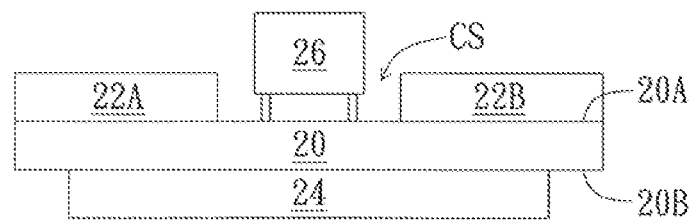

As shown in FIG. 4 and FIG. 5D, in the step S16, the method accommodates the chip 26 in the accommodating space CS and disposes the chip 26 on the exposed part of the first surface 20A. In practical applications, the chip 26 can be a driving chip applied to a display apparatus, but not limited to this.

Figure 5E:
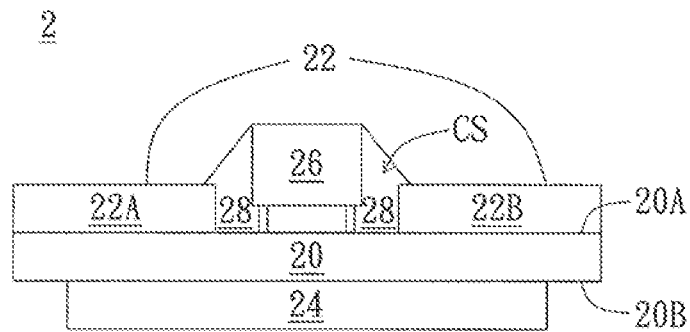

As shown in FIG. 4 and FIG. 5E, in the step S18, the method fills an encapsulant 28 into spaces between the chip 26 and the first part 22A and between the chip 26 and the second part 22B to form the double-sided COF packaging structure 2 shown in FIG. 2. In practical applications, the encapsulant 28 can be an underfill or any other filling materials capable of effectively filling the spaces between the chip 26 and the first part 22A of the first insulating layer 22 and between the chip 26 and the second part 22B of the first insulating layer 22, but not limited to this.

Figure 5F:
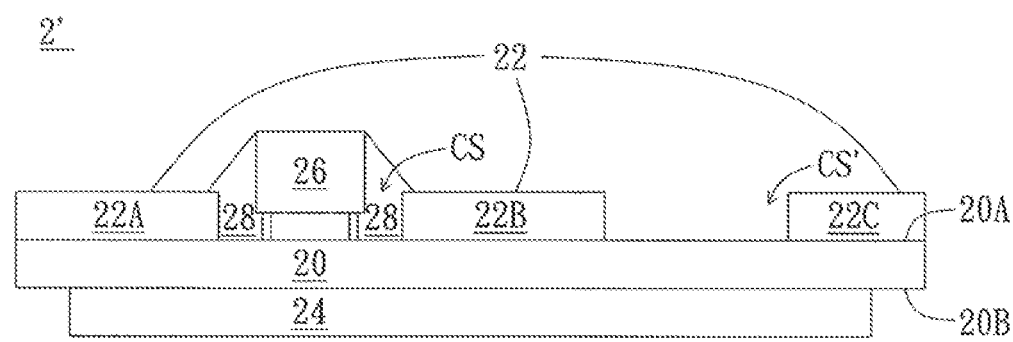

As shown in FIG. 4 and FIG. 5F, in the step S20, the method can further form another accommodating space CS' on the first insulating layer 22 to expose another exposed part of the first surface 20A, wherein the first insulating layer 22 further includes a third part 22C separated from the second part 22B. The another accommodating space CS' is located between the second part 22B and the third part 22C.

Figure 5G:
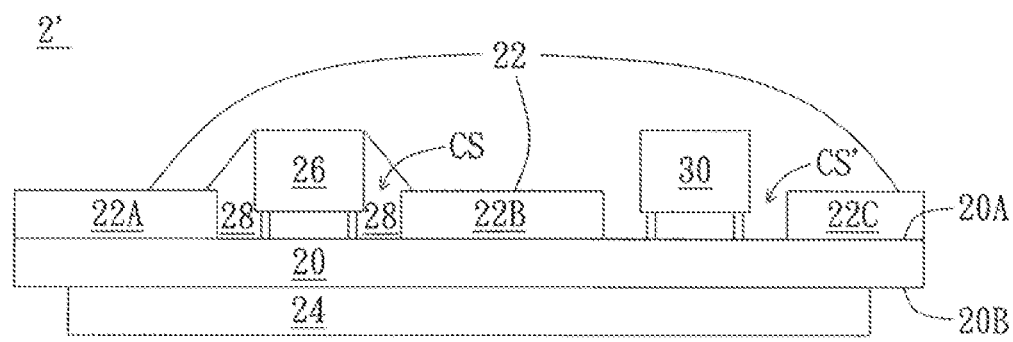

As shown in FIG. 4 and FIG. 5G, in the step S22, the method can accommodate a passive component 30 in the another accommodating space CS' and dispose the passive component 30 on the another exposed part of the first surface 20A to form the double-sided COF packaging structure 2' shown in FIG. 3.

Figure 1:
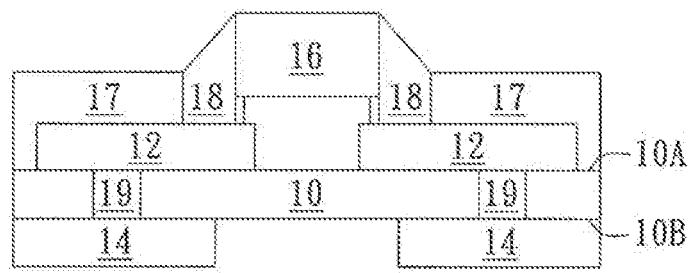
FIG. 1 illustrates a schematic diagram of a conventional double-sided COF packaging structure.

Compared to the prior art, since two insulating layers of the invention are disposed at two opposite sides of the metal layer respectively to avoid the via manufacturing process and via plating process used to manufacture the double-sided COF packaging structure 1 of FIG. 1, the complication of the entire manufacturing process can be largely reduced to effectively enhance the production yield. Therefore, the cost of manufacturing the double-sided COF packaging structure of the invention can be largely decreased and its competitiveness will be also enhanced.

In addition, since the traces in the entire double-sided COF packaging structure are all disposed in the same metal layer, the reliability of the double-sided COF packaging structure can be as good as the single-sided COF packaging structure, and a semi-additive process (SAP) or etching process can be also used to achieve the fine pitch effect, and the smallest pitch of 15 um can be even reached to decrease the volume of the entire double-sided COF packaging structure.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. A double-sided COF (chip on film) packaging structure, comprising:
   a metal layer having a first surface and a second surface, wherein the first surface and the second surface of the metal layer are opposite;
   a first insulating layer disposed on the first surface of the metal layer, wherein the first insulating layer comprises a first part and a second part separated from each other, and an accommodating space is existed between the first part and the second part and an exposed part of the first surface is exposed;
   a second insulating layer disposed on the second surface of the metal layer;
   a chip accommodated in the accommodating space and disposed on the exposed part of the first surface; and
   an encapsulant filling spaces between the chip and the first surface of the metal layer, between the chip and the first part and between the chip and the second part to form the double-sided COF packaging structure;
   wherein the first insulating layer further comprises a third part separated from the second part, another accommodating space is existed between the second part and the third part and another exposed part of the first surface is exposed, a passive component is accommodated in the another accommodating space and disposed on the another exposed part of the first surface; the metal layer is a single substrate connecting with the first part, the second part and the third part of the first insulating layer respectively; the encapsulant under the chip and the second insulating layer are disposed on the first surface and the second surface of the metal layer respectively; the encapsulant under the chip is separated from the second insulating layer.

2. The double-sided COF packaging structure of claim 1, wherein the metal layer is a copper foil.

3. The double-sided COF packaging structure of claim 1, wherein the first insulating layer and the second insulating layer are Polyimide (PI) or solder resist (SR).

4. The double-sided COF packaging structure of claim 1, wherein the encapsulant is an underfill.

5. A double-sided COF (chip on film) packaging structure manufacturing method, comprising steps of:
   providing a metal layer having a first surface and a second surface, wherein the first surface and the second surface of the metal layer are opposite;
   disposing a first insulating layer and a second insulating layer on the first surface and the second surface of the metal layer respectively;
   forming an accommodating space on the first insulating layer to expose an exposed part of the first surface, wherein the first insulating layer comprises a first part and a second part separated from each other;
   accommodating the chip in the accommodating space and disposing the chip on the exposed part of the first surface;
   filling an encapsulant into spaces between the chip and the first surface of the metal layer, between the chip and the first part and between the chip and the second part to form the double-sided COF packaging structure;
   forming another accommodating space on the first insulating layer to expose another exposed part of the first surface, wherein the first insulating layer further comprises a third part separated from the second part; and
   accommodating a passive component in the another accommodating space and disposing the passive component on the another exposed part of the first surface;
   wherein the metal layer is a single substrate connecting with the first part, the second part and the third part of the first insulating layer respectively; the encapsulant under the chip and the second insulating layer are disposed on the first surface and the second surface of the metal layer respectively; the encapsulant under the chip is separated from the second insulating layer.

6. The double-sided COF packaging structure manufacturing method of claim 5, wherein the metal layer is a copper foil.

7. The double-sided COF packaging structure manufacturing method of claim 5, wherein the first insulating layer and the second insulating layer are Polyimide (PI) or solder resist (SR).

8. The double-sided COF packaging structure manufacturing method of claim 5, wherein the encapsulant is an underfill.

* * * * *